US012795871B2

(12) United States Patent
Dilley et al.

(10) Patent No.: US 12,795,871 B2
(45) Date of Patent: Nov. 10, 2026

(54) INVERTER DEHUMIDIFICATION SYSTEM

(71) Applicant: EPC Power Corporation, Poway, CA (US)

(72) Inventors: Devin Dilley, Poway, CA (US); Shane Calloway, Poway, CA (US)

(73) Assignee: EPC Power Corporation, Poway, CA (US)

( * ) Notice: Subject to any disclaimer, the term of this patent is extended or adjusted under 35 U.S.C. 154(b) by 151 days.

(21) Appl. No.: 19/007,035

(22) Filed: Dec. 31, 2024

(65) Prior Publication Data

US 2026/0075777 A1 Mar. 12, 2026

Related U.S. Application Data

(60) Provisional application No. 63/691,883, filed on Sep. 6, 2024.

(51) Int. Cl.
*H05K 7/20* (2006.01)

(52) U.S. Cl.
CPC .................................. *H05K 7/2089* (2013.01)

(58) Field of Classification Search
CPC . H05K 5/0212; H05K 7/14322; H05K 7/2089
See application file for complete search history.

(56) References Cited

U.S. PATENT DOCUMENTS

| | | | |
|---|---|---|---|
| 4,786,301 A | 11/1988 | Rhodes | |
| 6,010,562 A | 1/2000 | Flynn et al. | |
| 2008/0135495 A1 | 6/2008 | Sher | |
| 2008/0180909 A1 | 7/2008 | Illerhaus et al. | |
| 2013/0258598 A1 | 10/2013 | Millner et al. | |
| 2014/0340842 A1* | 11/2014 | Towner | H05K 7/20309 165/104.34 |
| 2016/0302328 A1* | 10/2016 | Ross | F24F 5/0035 |
| 2018/0048218 A1 | 2/2018 | Im et al. | |
| 2018/0166996 A1 | 6/2018 | Zhao et al. | |
| 2018/0359883 A1 | 12/2018 | Schloo | |
| 2020/0061522 A1 | 2/2020 | Lilly | |

FOREIGN PATENT DOCUMENTS

| | | |
|---|---|---|
| CN | 105107343 A | 12/2015 |

OTHER PUBLICATIONS

Foreign Search Report on non-Foley case related to PCT Dtd Dec. 22, 2025.

* cited by examiner

*Primary Examiner* — Nathan Milakovich
(74) *Attorney, Agent, or Firm* — Foley & Lardner LLP

(57) ABSTRACT

An inverter system including a plurality of inverter housings each containing an inverter, each housing being fully fluidly sealed from an environment outside the housing except for one or more air inlets and one or more air outlets, a dehumidification system including a first desiccant dryer including a first desiccant bed, a first dryer inlet fluidly coupled to each air outlet, and a first dryer outlet fluidly coupled to each air inlet, and a pump configured to move air from the air outlets to the first dryer inlet.

18 Claims, 5 Drawing Sheets

INVERTER DEHUMIDIFICATION SYSTEM

CROSS-REFERENCE TO RELATED PATENT APPLICATIONS

This application claims the benefit of and priority to U.S. Provisional Patent Application No. 63/691,883, filed on Sep. 6, 2024, the entirety of which is hereby incorporated by reference herein.

BACKGROUND

Photovoltaic panels or solar panels convert energy from the sun into direct current. In order to supply the power generated by the panels to an electrical grid, the direct current typically must be converted to alternating current. Inverters are electronic devices used to convert direct current to alternating current. Direct current power produced by the panels may be supplied to an inverter, which may then convert the direct current to alternating current that can be supplied to the grid. Inverter components, including capacitors and other power switching components may be highly sensitive to moisture. The performance of the inverter may degrade, or the inverter may fail if these components get wet. However, solar energy power plants are typically located outdoors in open spaces exposed to the elements. Accordingly, it can be difficult to ensure that the components of the inverter are not exposed to high levels of humidity and moisture, particularly in environments in which significant overnight temperature drops can cause condensation in the housing of the inverter.

Figure 1:
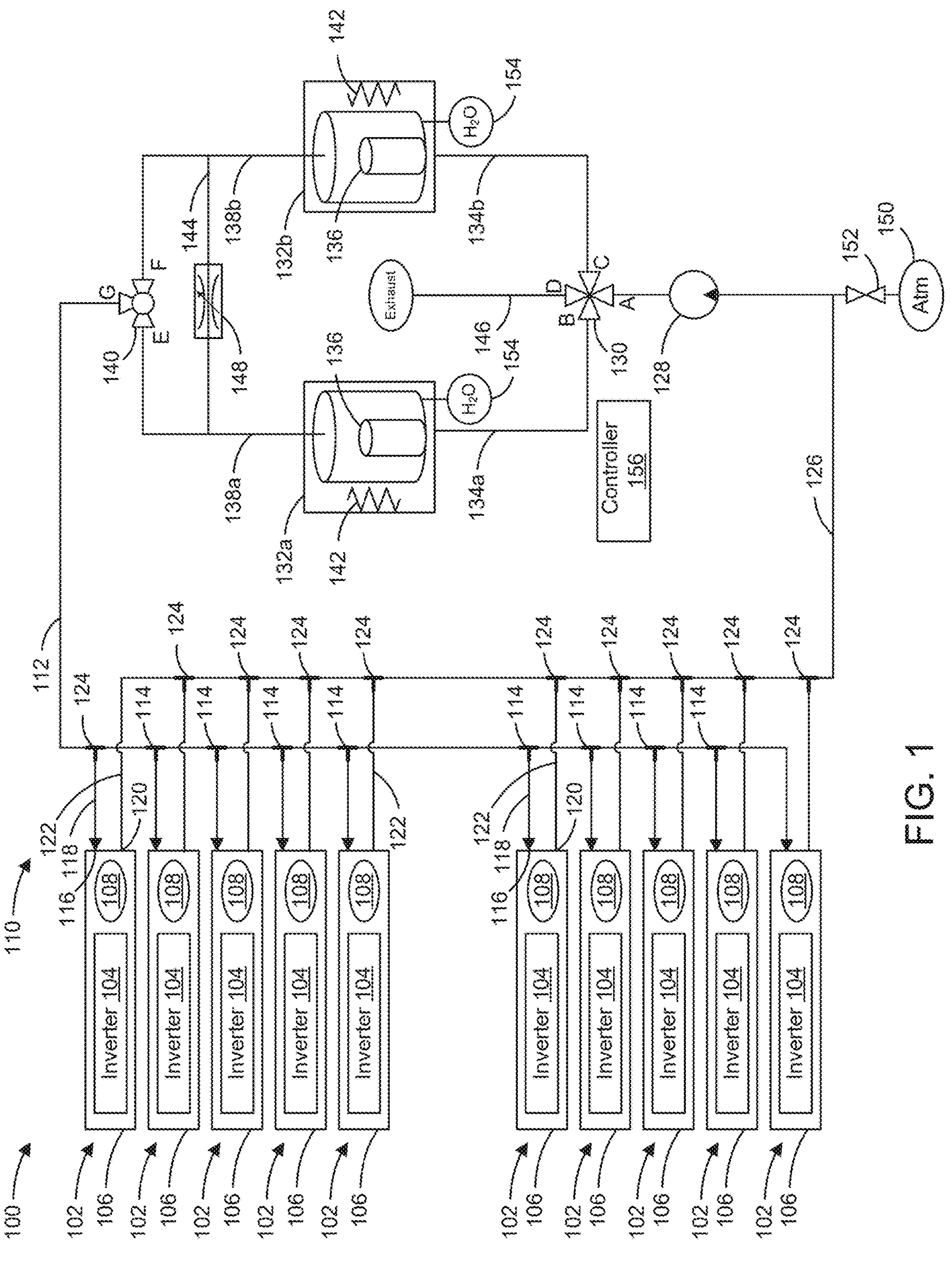
FIG. 1 depicts an example schematic diagram of an inverter system, according to an embodiment.

The foregoing and other features of the present disclosure will become apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

Solar power plants may include hundreds of solar panels and may require dozens of inverters to convert all of the direct current power produced by the panels to alternating current. An inverter system with multiple inverters may be installed to serve all of the panels or a subset of the panels. Each inverter may be positioned within a housing or enclosure. When an access door or cover of a housing is opened for maintenance or repairs during the day, hot, humid air may enter the housing. Further, if the inverter housing is not sealed, hot, humid air from the environment may enter the housing through cracks, seams, and openings in the housing. Overnight, when the temperature drops, the moisture in the air may condense onto sensitive electrical components of the inverter.

Embodiments of the present disclosure provide a dehumidification system that provides dry air to fully fluidly sealed inverter housings. Moist air, which may enter the housings when an access cover is open, is withdrawn from the inverter housings by the dehumidification system, dried using a desiccant dryer, and recirculated to the inverter housings. A small amount of atmospheric air may be added to replace air used to purge moisture from the desiccant dryer, but the dehumidification system otherwise forms a closed loop between the desiccant dryer and the inverter housings. Because the inverter housings are fully sealed when their access covers are closed, no new moisture may be added to the loop other than this small amount of atmospheric air. The desiccant dryer may thus be tasked with removing less and less moisture as the air is repeatedly circulated through the system, until a target humidity level is reached in the inverter housings. This may be more efficient than a system in which, for example, humid atmospheric air is dried and supplied to an inverter housing that is not fully sealed and allows the air inside the housing to leak to the environment.

Referring to FIG. 1, an inverter system 100 is shown, according to some embodiments. As shown in FIG. 1, the inverter system 100 includes ten inverter modules 102. In other embodiments, the inverter system 100 may include more (e.g., 12, 15, 20, etc.) or fewer (e.g., 2, 5, 8, etc.) inverter modules 102. Each inverter module 102 includes an inverter 104 positioned within an inverter housing 106. Each inverter module 102 may also include additional components within the inverter housing 106, including a moisture sensor 108. Each housing 106 may be approximately 0.5 cubic meters in size, though in some embodiments, the housings may be smaller or larger.

The inverter system 100 includes a dehumidification system 110. The dehumidification system 110 is configured to maintain the humidity of the inside of the inverter housings 106 below a maximum operating level for the components of the inverters 104. The dehumidification system 110 provides dry air via a primary dry air line 112 to the inverter modules 102. The primary dry air line 112 provides dry air to inlet junctions 114 associated with each inverter module 102. The dry air is provided from each inlet junction 114 to an air inlet 116 of the inverter housing 106 via a respective inlet line 118. The dry air from the inlet lines 118 may mix with the air in the inverter housings 106, which may be more humid than the dry air. As the relatively low humidity dry air mixes with the relatively high humidity air in the inverter housings 106, the overall humidity inside the inverter housings 106 may drop. If there is condensed water inside the inverter housings 106, at least some of this condensed water may evaporate.

Each inverter housing 106 further includes an air outlet 120 connected to an outlet line 122. As the dry air is provided to an inverter housing 106, the pressure inside the inverter housing may increase, and some of the air may be forced out of the air outlet 120 into the respective outlet line 122. The air forced out of the inverter housing 106 may be a mixture of the dry air supplied via the air inlet 116 and the relatively high humidity air in the inverter housing 106. Thus, the humidity of the air forced out of the inverter housing 106 via the air outlet 120 may be higher than the dry air supplied via the air inlet 116. As additional dry air is continuously or repeatedly supplied to the inverter housing 106 via the air inlet 116 and relatively high-humidity air is forced out of the inverter housing via the air outlet 120, the humidity inside the inverter housing 106 may continue to drop. With sufficient time, the humidity inside the inverter housing 106 may approach or be equal to the humidity of the dry air supplied via the air inlet 116, and all of the liquid water in the inverter housing 106 may evaporate. The dehumidification system 110 may reduce the dew point in the inverter housing 106 to below −20 degrees Celsius, which may ensure that almost no moisture in the air in the inverter housing 106 is able to condense in most environments.

Figure 3:
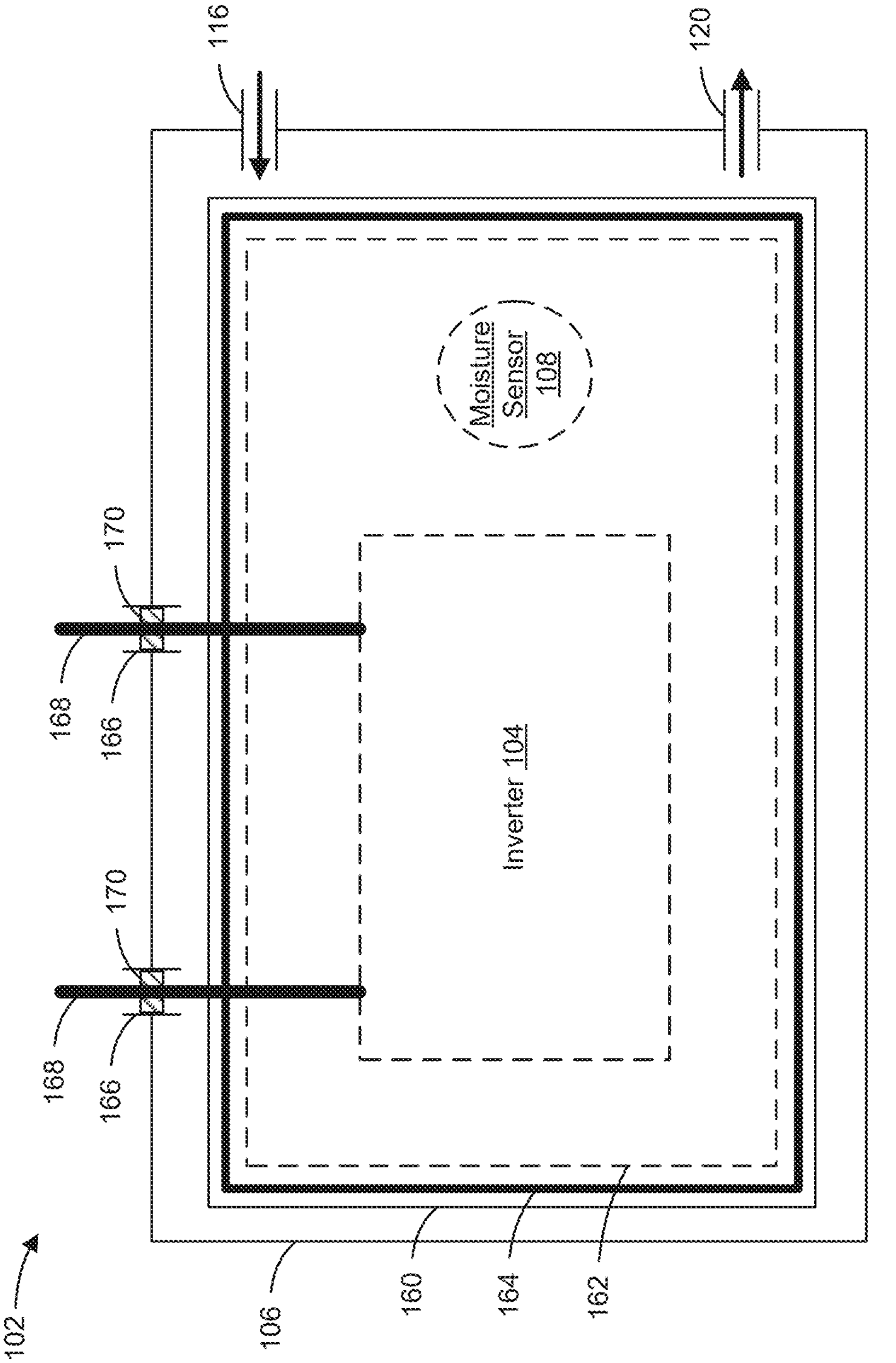
FIG. 3 depicts an example of an inverter module of the inverter system of FIG. 1, according to an embodiment.

FIG. 3 shows an inverter module 102 in further detail, according to some embodiments. Each inverter housing 106 may include an access door or cover 160 over an opening 162 allowing a technician or user to access the inverter 104 and other components within the inverter housing 106 for maintenance, inspection, or repairs. Humid air may be introduced into the inverter housing 106 when the door or cover 160 is open and may be trapped inside when closing the door or replacing the cover. Thus, the dehumidification system 110 may be utilized following any procedure that includes opening the door or cover 160. However, each inverter housing 106, when closed, may be completely and fully fluidly sealed except for the air inlet 116 and the air outlet 120. Thus, additional moisture may not be introduced into the inverter housing 106 when the inverter housing 106 is closed. For example, the inverter housing 106, when closed, may not include any additional vents, openings, or cracks providing fluid communication between the inside of the inverter housing 106 and the outside of the inverter housing 106. The door or cover may include a seal 164 and/or gaskets (e.g., rubber or silicon strips) such that the interface between the door or cover 160 and the body of the inverter housing 106 is airtight.

Figure 2:
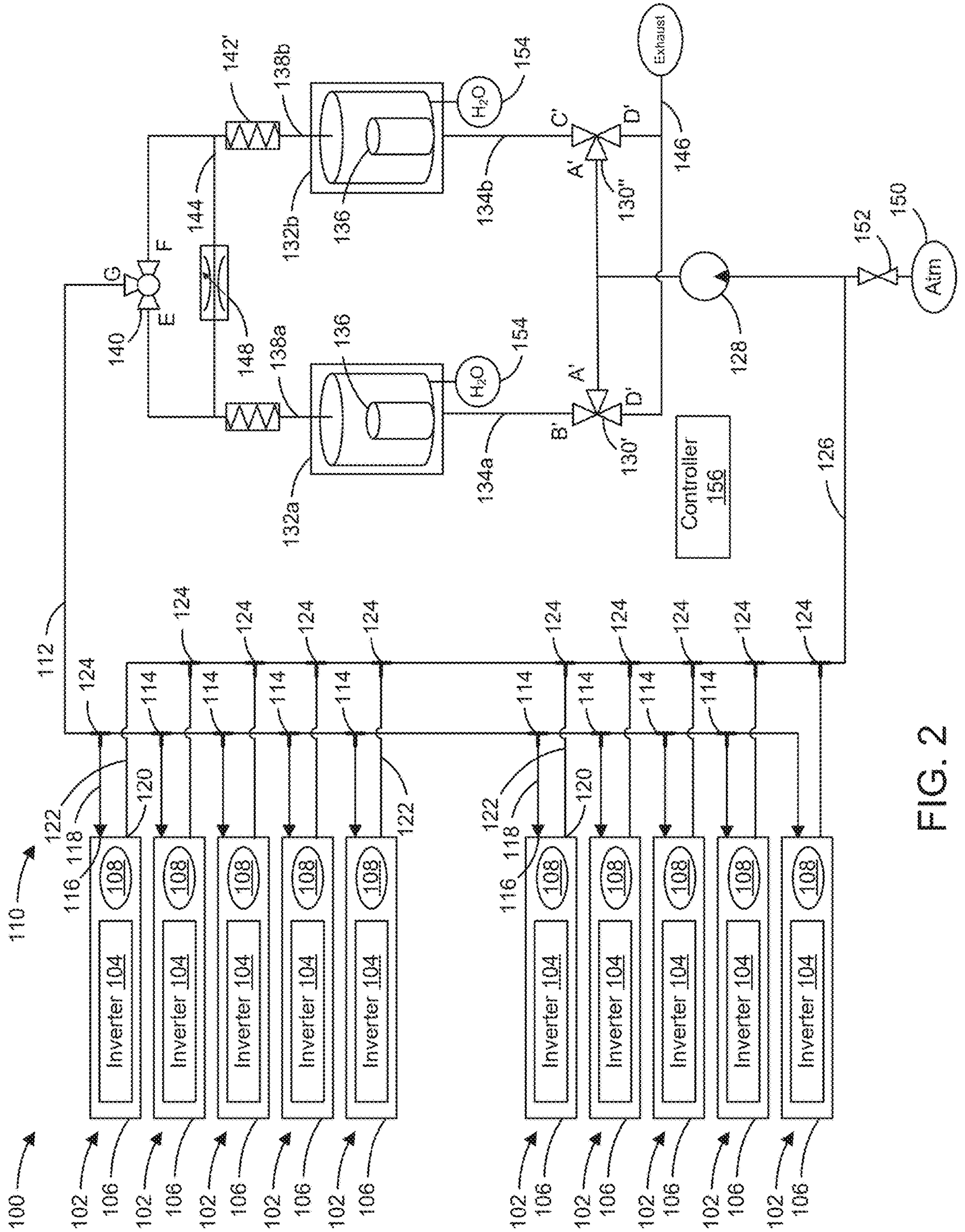
FIG. 2 depicts an example schematic diagram of an inverter system, according to an embodiment.

As discussed above, the inverter 104 may be configured to convert direct current generated by solar panels to alternating current that can be supplied to an electrical grid. Each inverter housing 106 may include apertures 166 allowing for electrical connectors 168 (e.g., wires) to extend to the inverter 104 from outside the inverter housing 106 to make electrical connections. For example, a first electrical connector 168 may carry direct current to the inverter 104 from the solar panels to the inverter 104, and a second electrical connector 168 may carry alternating current from the inverter 104 out of the inverter housing 106 to the grid. Each aperture may include a seal 170 that fully fluidly seals the aperture around the electrical connector 168. In some embodiments, the aperture 166 may include a fully fluidly sealed terminal. For example, a first wire outside the inverter housing 106 may terminate at the terminal and be electrically connected by the terminal to a second wire inside the inverter housing 106. In any case, no air may be exchanged between the inside and the outside of the inverter housing 106 through the apertures 166. When the access door or cover 160 is closed, the inside of the inverter housing 106 may be fluidly coupled to the outside of the inverter housing 106 only via the air inlet 116 and the air outlet 120. While only one air inlet 116 and one air outlet 120 are shown, it should be understood that each inverter housing may include multiple air inlets 116 and/or air outlets 120 each fluidly coupled to the primary dry air line 112 or the primary outlet line 126 respectively. For example, the inlet line 118 of each inverter housing may split into multiple lines coupled to multiple air inlets 116 in various locations in the Referring again to FIG. 1, the relatively high-humidity air expelled from the inverter housings 106 via the air outlets 120 are supplied via the outlet lines to outlet junctions 124, where they join a primary outlet line 126. The primary outlet line 126 is fluidly coupled to a pump 128 (or compressor, blower, etc.) that pressurizes the relatively high-humidity air and supplies it to a first valve assembly 130. The first valve assembly 130 may selectively fluidly couple the first desiccant dryer 132*a* or the second desiccant dryer 132*b* to the primary outlet line 126 and thereby to the air outlets 120. The first valve assembly 130 includes four ports A-D. The pressurized air from the pump 128 is supplied to the first port A and may be selectively released via either the second port B or the third port C. The second port B is fluidly coupled to a first desiccant dryer 132*a* via first dryer inlet 134*a*, and the third port C is fluidly coupled to a second desiccant dryer 132*b* via second dryer inlet 134*b*. In some embodiments, the first valve assembly 130 may be a four-way valve, with each port being an opening that can be fluidly coupled to an adjacent opening by rotating a plug. In other embodiments, the dehumidification system 110 may include multiple separate valves rather than a first valve assembly 130 with four ports. FIG. 2 shows an inverter system 100 in which the dehumidification system 110 includes two three way valves 130', 130" rather than a single four-way valve 130.

The desiccant dryers 132 each include a desiccant bed 136 including desiccant (water-adsorbing) material. The air exhausted from the inverter housings 106 may pass through the desiccant bed 136 of one of the desiccant dryers 132, in which water in the air may be adsorbed. The dried air may be exhausted to one of the dryer outlets 138*a*, 138*b*, which are respectively fluidly coupled to a first port E and a second port F of a second valve assembly 140. The second valve assembly is configured to selectively couple the first dryer outlet 138*a* or the second dryer outlet 138*b* to the primary dry air line 112 and thereby to each air inlet 116. The dried air from one of the dryer outlets 138*a*, 138*b* is released via the third port G to the primary dry air line 112 and recirculated to the inverter modules 102. In some embodiments, the second valve assembly 140 may be a three-way valve. In other embodiments, the dehumidification system 110 may include multiple separate valves rather than a second valve assembly 140 with three ports.

As discussed above, the relatively high-humidity air expelled from the inverter housings 106 is selectively supplied by the first valve assembly 130 to one of the two desiccant dryers 132 at a time. For example, in a first time period, the first valve assembly 130 may supply the relatively high-humidity air to the first desiccant dryer 132*a*. Over the course of the first time period, the desiccant bed 136 of the first desiccant dryer 132*a* may adsorb water and become saturated. When the desiccant bed 136 of the first desiccant dryer 132*a* is saturated to the point that water can no longer be effectively adsorbed, the first valve assembly 130 may stop supplying the relatively high-humidity air to the first desiccant dryer 132*a* and begin supplying the relatively high-humidity air to the second desiccant dryer 132*b* via the third port C for a second time period. In some embodiments, each desiccant dryer 132 includes a moisture sensor 154 configured to measure the saturation level of the desiccant bed 136. The measurements taken by the moisture sensors 154 may be used to determine when to switch the flow of relatively high-humidity air to the other of the two desiccant dryers 132. The second valve assembly 140 may close the first port E and open the second port F, such that the dried air from the first desiccant dryer 132*a* is now recirculated to the inverter modules 102 via the third port G and the primary dry air line 112.

Each desiccant dryer 132 includes a heater 142 (e.g., a resistive heater) to heat the desiccant bed 136 of the respective desiccant dryer 132. The heat may cause the liquid water adsorbed by the desiccant bed 136 to evaporate, drying (or regenerating) the desiccant bed 136. In some embodiments, the desiccant dryer 132 may include a vacuum dryer instead of or in addition to the heaters 142. In the second time period discussed above, in which the desiccant bed 136 of the first desiccant dryer 132*a* is saturated and the relatively high-humidity air is being supplied to the second desiccant dryer 132*b*, the heater of the first desiccant dryer 132*a* may be activated to dry the desiccant bed 136 of the first desiccant dryer 132*a*. The evaporation of water in the desiccant bed 136 causes the formation of water vapor in the first desiccant dryer 132*a*.

The dehumidification system 110 includes a regeneration air line 144 connecting the dryer outlets 138*a*, 138*b*. Some of the dry air released from the second desiccant dryer 132*b* may flow from the second dryer outlet 138*b* to the first dryer outlet 138*a* through the regeneration air line 144. The regeneration air line 144 includes a restrictor valve 148 to control the amount of dry air allowed to flow through the regeneration air line 144. The first valve assembly 130 may fluidly couple the second port B to the fourth port D, which is fluidly coupled to an exhaust line 146. With the first port E of the second valve assembly 140 closed and the second port B fluidly coupled to the exhaust line 146, the dry air from the regeneration air line 144 may flow through the first desiccant dryer 132*a* and carry the water vapor out of the first desiccant dryer 132*a* and into the exhaust line 146, where it may be exhausted from the dehumidification system 110.

When the desiccant bed 136 of the first desiccant dryer 132*a* is sufficiently dried, or when the desiccant bed 136 of the second desiccant dryer 132*b* is saturated, the first valve assembly 130 may switch back to supplying the relatively high-humidity air to the first desiccant dryer 132*a*, and the heater of the second desiccant dryer 132*b* may be activated to begin drying the desiccant bed 136 of the second desiccant dryer 132*b*. Dry air may flow from the first desiccant dryer 132*a* through the first dryer outlet 138*a*, the regeneration air line 144, and the second dryer outlet 138*b* to the second desiccant dryer 132*b*. The first valve assembly 130 may fluidly couple the third port C to the fourth port D, such that water vapor produced by heating the desiccant bed of the second desiccant dryer 132*b* may be exhausted via the exhaust line 146.

The dehumidification system 110 includes an atmospheric air inlet 150 through which atmospheric air may be mixed with the relatively high-humidity air in the primary outlet line 126. An atmospheric air valve 152 may be opened to allow atmospheric air to flow from the atmospheric air inlet 150 to the pump 128. Atmospheric air may be added in a volume sufficient to replace the air removed from the system via the exhaust line 146. This may ensure that the air pressure in the air lines and the inverter housings 106 remains approximately equal to or slightly higher than the atmospheric air pressure and that the water vapor produced by heating the desiccant beds 136 flows toward the exhaust line 146.

As discussed above, FIG. 2 shows an inverter system 100 according to some embodiments. The inverter system 100 of FIG. 2 may be substantially similar to the inverter system of FIG. 1, except as shown and described herein. The dehumidification system 110 of the inverter system 100 of FIG. 2 includes two three way valves 130', 130" rather than a single four-way valve 130. The two three way valves 130', 130" each include an input port A' fluidly coupled to the pump 128 and configured to receive the relatively high-humidity air and an output port D' fluidly coupled to the exhaust line 146. The first three way valve 130'includes a dryer port B' fluidly coupled to the first desiccant dryer 132*a*, and the second three way valve 130'includes a dryer port C' fluidly coupled to the second desiccant dryer 132*b*. The three way valves 130', 130" may couple their respective dryer port B', C' to the input port A' to supply the relatively high-humidity air to the respective desiccant dryer 132*a*, 132*b*. The three way valves 130', 130" may couple their respective dryer port B', C' to the output port D' when purging moisture from the respective desiccant bed 136.

The dehumidification system 110 of FIG. 2 also includes heaters 142' positioned in the dryer outlets 138*a*, 138*b* rather than adjacent the desiccant beds 136. During a regeneration cycle (e.g., when a desiccant bed 136 is being dried), the dry air output by one of the two desiccant dryers 132*a*, 132*b* may be heated by the heaters 142' and supplied to the desiccant bed of the opposite desiccant dryer 132*a*, 132*b*. The heated dry air may pass through the desiccant bed 136, causing moisture adsorbed therein to evaporate and be carried out of the desiccant dryer 132*a*, 132*b* to the exhaust line 146. The heater 142' in the dryer outlet 138*a*, 138*b* or the active desiccant dryer 132*a*, 132*b* may also heat the dried air that is supplied to the inverter housings 106 to further improve the evaporation of water in the inverter housings 106.

Figure 4:
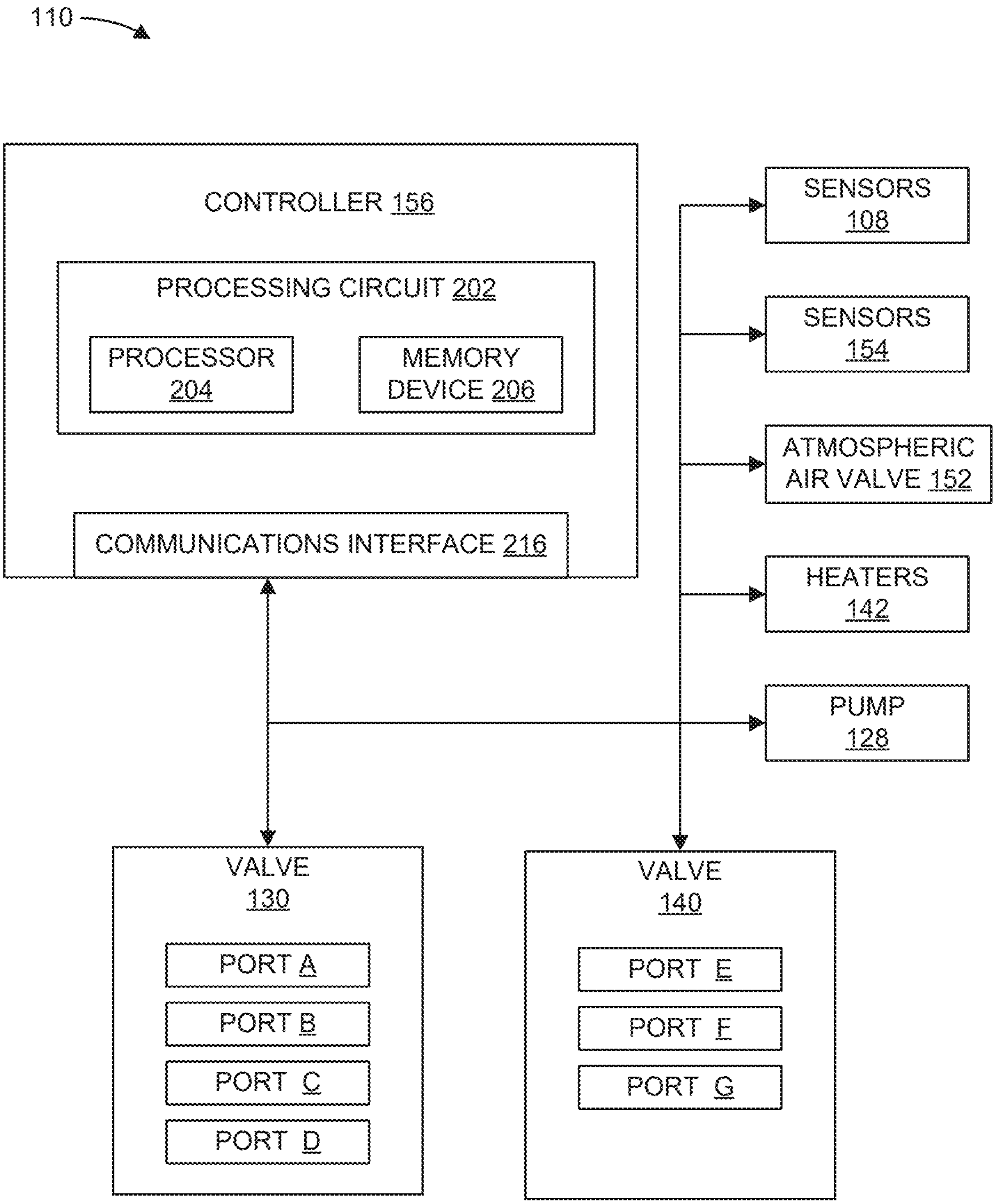
FIG. 4 depicts an example schematic diagram of a dehumidification system of the inverter system of FIG. 1, according to an embodiment.

As shown in further detail in FIG. 4, the dehumidification system includes a controller 156 communicatively coupled to and configured to control operation of the valves 130, 140, 152, the pump 128, the heaters 142, and the sensors 108, 154. As shown, the controller 156 includes at least one processing circuit 202 having at least one processor 204, at least one memory device 206, and a communications interface 216. The controller 156 is configured to control the operation of the dehumidification system 110.

The at least one processor 204 may be implemented as one or more single- or multi-chip processors, digital signal processors (DSPs), application specific integrated circuits (ASICs), field programmable gate arrays (FPGAs), and/or suitable processors (e.g., other programmable logic devices, discrete hardware components, etc. to perform the functions described herein). A processor may be a microprocessor, a group of processors, etc. A processor also may be implemented as a combination of computing devices, such as a combination of a DSP and a microprocessor, a plurality of microprocessors, one or more microprocessors in conjunction with a DSP core, or any other such configuration. In some embodiments, the one or more processors may be shared by multiple circuits. Alternatively or additionally, the one or more processors may be structured to perform or otherwise execute certain operations independent of one or more co-processors. In other example embodiments, two or more processors may be coupled via a bus to enable independent, parallel, pipelined, or multi-threaded instruction execution. All such variations are intended to fall within the scope of the present disclosure.

The at least one memory device 206 (e.g., memory, memory unit, storage device) may include one or more devices (e.g., RAM, ROM, Flash memory, hard disk storage) for storing data and/or computer code for completing or facilitating the various processes, layers and modules described in the present disclosure. For example, the memory device 206 may include dynamic random-access memory (DRAM). The memory device 206 may be communicably connected to the processor 204 to provide computer code or instructions to the processor 204 for executing at least some of the processes described herein. Moreover, the memory device 206 may be or include tangible, non-transient volatile memory or non-volatile memory. Accordingly, the memory device 206 may include database components, object code components, script components, or any other type of information structure for supporting the various activities and information structures described herein.

The communications interface 216 may include any combination of wired and/or wireless interfaces (e.g., jacks, antennas, transmitters, receivers, transceivers, wire terminals) for conducting data communications with various systems, devices, or networks structured to enable communication with the other components of the dehumidification system 110. The communications interface 216 may be structured to communicate via local area networks or wide area networks (e.g., the Internet) and may use a variety of communications protocols (e.g., IP, LON, Bluetooth, ZigBee, radio, cellular, near field communication).

As discussed above, the controller 156 may be configured to control operation of the dehumidification system 110 according to instructions stored in the at least one memory device 206. The at least one processor 204 may execute the instructions and cause commands to be sent to the component of the dehumidification system 110 via the communications interface 216. For example, the controller may receive sensor data from the moisture sensors 108 indicating the humidity or moisture level in the inverter housings 106. When the moisture sensors 108 indicate that the humidity or moisture level in the inverter housings 106 are above a maximum threshold humidity or moisture level, the controller 156 may control the pump 128 to circulate air through the dehumidification system 110. In some embodiments, the controller 156 may operate the pump 128 if at least one of the moisture sensors 108 indicate that the humidity or moisture level in at least one of the inverter housings 106 exceeds the maximum threshold. The controller 156 may control the first valve assembly 130 to allow air to flow from the pump 128, through the first port A and the second port B, to the first desiccant dryer 132*a*. The controller may control the second valve assembly 140 to allow dried air to from the first desiccant dryer 132*a* through the first port E and the third port G to the primary dry air line 112 to the inverter modules 102.

The controller 156 may receive sensor data from the moisture sensor 154 of the first desiccant dryer 132*a* indicating the saturation level of the desiccant bed 136. If the sensor data from the moisture sensor 154 indicates that the saturation level of the desiccant bed 136 exceeds a maximum threshold saturation level, and the sensor data from the moisture sensors 108 indicate that the humidity or moisture levels in the inverter housings 106 still exceed the maximum threshold humidity or moisture level, the controller 156 may control the first valve assembly 130 to begin supplying the air from the pump 128 to the second desiccant dryer 132*b*. The controller 156 may send a signal to the first valve assembly 130 to allow the air to flow through the first port A to the third port C and to block the flow of air from the first port A to the second port B. The controller 156 may send a signal to the second valve assembly 140 to allow the air to flow through the second port F to the third port G and to block the flow of air from the first port E.

While the air is flowing through the second desiccant dryer 132*b*, the controller 156 may send a signal to the heater 142 of the first desiccant dryer 132*a* causing the heater to activate and begin drying the desiccant bed 136 of the first desiccant dryer 132*a*. The controller 156 may send a signal to the first valve assembly 130 to allow air to flow from the first port A to the fourth port D and to the exhaust line 146. As discussed above, air may flow from the second dryer outlet 138*b*, through the regeneration air line 144 and the restrictor valve 148, and through the first desiccant dryer 132*a* to sweep water vapor toward the exhaust line 146. The controller 156 may send a signal to the atmospheric air valve 152 to allow atmospheric air to flow from the atmospheric air inlet 150 to the pump 128.

After switching the flow of air from the first desiccant dryer 132*a* to the second desiccant dryer 132*b*, the controller 156 may send signals to switch the flow back to the first desiccant dryer 132*a*. In some embodiments, the flow may be switched back to the first desiccant dryer 132*a* when sensor data from the moisture sensor 154 of the second desiccant dryer 132*b* indicates that the desiccant bed 136 of the second desiccant dryer 132*b* is saturated. In some embodiments, the flow may be switched back to the first desiccant dryer 132*a* when sensor data from the moisture sensor 154 of the first desiccant dryer 132*a* indicates that the desiccant bed 136 of the first desiccant dryer 132*a* is dry (e.g., to below a minimum threshold saturation level). In some embodiments, the flow may be switched back to the first desiccant dryer 132*a* after a predetermined amount of time. In some embodiments, any of these triggers (saturation level of either desiccant bed or the passage of time) may be used in combination. If the sensor data from the moisture sensors 108 of the inverter modules 102 indicates that the humidity or moisture levels in the inverter housings 106 (e.g., in each of the inverter housings) are below a minimum threshold humidity or moisture level, the controller 156 may send a signal to stop the operation of the pump 128.

Figure 5:
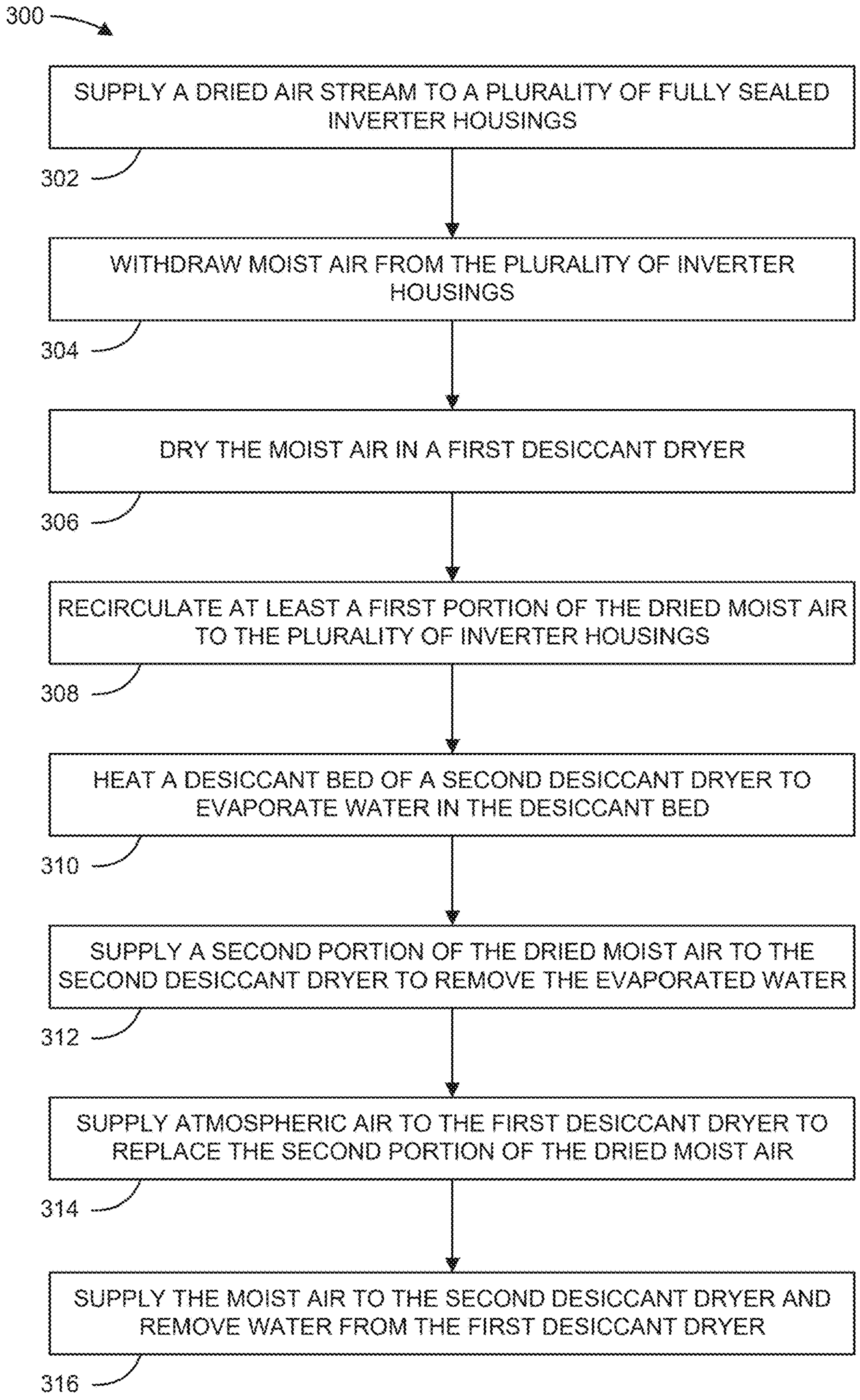
FIG. 5 is a flow chart of an implementation of a method for drying inverter housings in an inverter system, according to an embodiment.

Referring now to FIG. 5, a method 300 for drying inverter housings is shown, according to some embodiments. The method 300 may be performed, for example, by the dehumidification system 110 and may include or may be performed in response to determining that the moisture or humidity level in at least one of the inverter housings exceeds a maximum threshold or level. At operation 302 of the method 300, a dried air stream is supplied to a plurality of inverter housings. The inverter housings may be fully fluidly sealed, each with a single air inlet and a single air outlet. Any other inputs, such as electrical or communications inputs into the inverter housing may be fully fluidly sealed to ensure that substantially no air is exchanged between the inside of the housing and the outside of the housing. The inverter housings may house inverters and other associated equipment, including moisture sensors. The inverter housings may include access doors or covers that can be opened to access the equipment in the housings. However, when the access doors or covers are closed, they may fully fluidly seal the openings such that substantially no air may be exchanged through the edges. An inverter housing may be considered "fully fluidly sealed" when closed despite having an access door or cover that can be opened.

In some embodiments, air may be supplied to other fully fluidly sealed housings that do not house inverters.

At operation 304 of the method 300, moist air is withdrawn from the inverter housings. As discussed above, the inverter housings each include a single air outlet through which the air is withdrawn. During the method 300, air may enter the inverter housings through only the single air inlet at operation 302 and be withdrawn through only the single air outlet at operation 304.

At operation 306 of the method 300, the moist air withdrawn from the inverter housings is dried in a first desiccant dryer. At operation 308 of the method 300, at least a first portion of the dried moist air is recirculated to the plurality of inverter housings. Operation 308 may be substantially the same as operation 302. Thus, a semi-closed air loop may be formed between the inverter housings and the first desiccant dryer. While in the examples above, it is suggested that each inverter housing includes only one air inlet and one air outlet, in some embodiments, each inverter housing may include more than one air inlet or air outlet. However, each air inlet of the housings may be fluidly coupled to an outlet of the first desiccant dryer, and each air outlet of the housings may be fluidly coupled to an inlet of the first desiccant dryer. For example, an outlet line from the desiccant dryer may split into multiple lines that supply dry air to different portions of each inverter housing. Each inverter housing may also include multiple air outlets that later merge to form an outlet line that is supplied to an inlet of the first desiccant dryer.

At operation 310 of the method 300, a desiccant bed of a second desiccant dryer is heated to evaporate water in the desiccant bed. At operation 312 of the method 300, a second portion of the dried moist air from the first desiccant dryer is supplied to the second desiccant dryer to remove the evaporated water from the second desiccant dryer. The evaporated water and the second portion of the dried moist air may be exhausted from the semi-closed air loop. At operation 314 of the method 300, atmospheric air is supplied to the first desiccant dryer to replace the second portion of the dried moist air. This may ensure that the pressure in the semi-closed air loop remains stable and air continues to flow through the first desiccant dryer and the inverter housings.

At operation 316, the moist air from the inverter housings is supplied to the second desiccant dryer rather than the first desiccant dryer. Operations 302-308 continue, except that the functions of the first desiccant dryer are now performed by the second desiccant dryer. Also at operation 316, water is removed from the first desiccant dryer using operations corresponding to operations 310-314. Specifically, at operation 316, the moist air from the inverter housings is supplied to the second desiccant dryer and dried, and a first portion of the dried moist air is recirculated to the inverter housings. A desiccant bed of the first desiccant dryer is heated to evaporate water in the desiccant bed. A second portion of the dried moist air is supplied to the first desiccant dryer to remove the evaporated water from the first desiccant dryer. Operation 316 may be performed in response to, for example, a detected saturation level in the desiccant bed of the first desiccant dryer exceeding a maximum limit or threshold or a detected saturation level in the second desiccant dryer going below a minimum limit or threshold.

In one aspect, the present disclosure describes an inverter system including a plurality of inverter housings each containing an inverter, each housing being fully fluidly sealed from an environment outside the housing except for one or more air inlets and one or more air outlets, a dehumidification system including a first desiccant dryer comprising a first desiccant bed, a first dryer inlet fluidly coupled to each air outlet, and a first dryer outlet fluidly coupled to each air inlet, and a pump configured to move air from the air outlets to the first dryer inlet. In some embodiments, each of the air outlets is fluidly coupled in parallel to the first dryer inlet via a primary outlet line and each of the air inlets is fluidly coupled in parallel to the first dryer outlet via a primary inlet line.

In some embodiments, each inverter housing includes at least one aperture through which electrical connections are made between the inverter and the outside of the inverter housing, wherein every aperture is fully fluidly sealed when the electrical connections are made.

In some embodiments, each inverter housing includes an access cover openable to provide access to the inverter via an opening, wherein the opening is fully fluidly sealed when the access cover is closed.

In some embodiments, the inverter system includes a plurality of first moisture sensors each configured to measure the humidity in one of the inverter housings and a controller communicatively coupled to the plurality of first moisture sensors and the pump. The controller includes at least one processor and at least one memory storing instructions that, when executed by the at least one processor, cause the controller to receive moisture sensor data from the plurality of first moisture sensors, determine, based on the moisture sensor data, that the humidity in at least one of the plurality of inverter housings exceeds a threshold humidity, and cause the pump to move the air in response to determining that the humidity exceeds the threshold humidity.

In some embodiments, the dehumidification system includes a second desiccant dryer comprising a second desiccant bed, a second dryer inlet, and a second dryer outlet, a first valve assembly configured to selectively fluidly couple the second dryer inlet to each air outlet and to selectively fluidly decouple the first dryer inlet from each air outlet, and a second valve assembly configured to selectively fluidly couple the second dryer outlet to each air inlet and to selectively fluidly decouple the first dryer outlet from each air inlet. In some embodiments, the inverter system further includes a second moisture sensor configured to measure a saturation level of the first desiccant bed, a third moisture sensor configured to measure a saturation level of the second desiccant bed, and a controller communicatively coupled to the first valve assembly and the second valve assembly. The controller includes at least one processor and at least one memory storing instructions that, when executed by the at least one processor, cause the controller to: =receive moisture sensor data from the second moisture sensor and the third moisture sensor and, upon identifying a first indication based on the moisture sensor data, cause the first valve assembly to fluidly couple the second dryer inlet to each air outlet and fluidly decouple the first dryer inlet from each air outlet, and to cause the second valve assembly to fluidly couple the second dryer outlet to each air inlet and fluidly decouple the first dryer outlet from each air inlet.

In some embodiments, the first indication indicates that the saturation level of the first desiccant bed exceeds a maximum threshold. In some embodiments, the first indication indicates that the saturation level of the second desiccant bed is below a minimum threshold. In some embodiments, the first desiccant dryer includes a heater adjacent the first desiccant bed and configured to evaporate water captured in the first desiccant bed, wherein the instructions further cause the controller to cause the heater to activate upon identifying the first indication. In some embodiments, the first dryer outlet is fluidly coupled to the second dryer outlet, wherein the instructions further cause the first valve assembly to fluidly couple the first dryer inlet to an exhaust line upon identifying the first indication. In some embodiments, the first dryer outlet is fluidly coupled to the second dryer outlet via a restrictor valve.

In one aspect, the present disclosure describes a method of drying inverter housings. The method includes supplying a dried air stream to a plurality of fully fluidly sealed inverter housings, withdrawing moist air from the inverter housings, drying the moist air in a first desiccant dryer, and recirculating at least a first portion of the dried moist air from the first desiccant dryer to the inverter housings. In some embodiments, the method includes heating a desiccant bed of a second desiccant dryer to evaporate water in the desiccant bed and supplying a second portion of the dried moist air to the second desiccant dryer to remove the evaporated water. In some embodiments, the method includes supplying atmospheric air to the first desiccant dryer to replace the second portion of the dried moist air.

In some embodiments, the method includes stopping a flow of the moist air to the first desiccant dryer, drying the moist air in a second desiccant dryer, and recirculating at least a first portion of the dried moist air from the second desiccant dryer to the inverter housings. In some embodiments, when the moist air is dried by the first desiccant dryer, the moist air is supplied to the first desiccant dryer via a first dryer inlet and the dried moist air is released from the first desiccant dryer via a first dryer outlet, and when the moist air is dried by the second desiccant dryer, the moist air is supplied to the second desiccant dryer via a second dryer inlet, the dried moist air is released from the second desiccant dryer via a second dryer outlet, and a second portion of the dried moist air is supplied from the second desiccant dryer to the first desiccant dryer via the first dryer outlet. In some embodiments, the flow of the moist air to the first desiccant dryer is stopped in response to determining that a saturation level of a first desiccant bed of the first desiccant dryer exceeds a maximum threshold. In some embodiments, the flow of the moist air to the first desiccant dryer is stopped in response to determining that a saturation level of a second desiccant bed of the second desiccant dryer is below a minimum threshold. In some embodiments, the moist air is withdrawn from the inverter housings and dried in response to determining that a humidity in at least one of the inverter housings exceeds a maximum humidity.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." Further, unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. An inverter system comprising:

a plurality of inverter housings each containing an inverter, each housing being fully fluidly sealed from an environment outside the housing except for one or more air inlets and one or more air outlets;

a dehumidification system including a first desiccant dryer comprising a first desiccant bed, a first dryer inlet fluidly coupled to each air outlet, and a first dryer outlet fluidly coupled to each air inlet, wherein each of the air outlets is fluidly coupled in parallel to the first dryer inlet via a primary outlet line and each of the air inlets is fluidly coupled in parallel to the first dryer outlet via a primary inlet line; and a pump configured to move air from the air outlets to the first dryer inlet.

2. The inverter system of claim 1, wherein each inverter housing includes at least one aperture through which electrical connections are made between the inverter and the outside of the inverter housing, wherein every aperture is fully fluidly sealed when the electrical connections are made.

3. The inverter system of claim 1, further comprising:

a plurality of first moisture sensors each configured to measure the humidity in one of the inverter housings; and a controller communicatively coupled to the plurality of first moisture sensors and the pump, the controller comprising at least one processor and at least one memory storing instructions that, when executed by the at least one processor, cause the controller to:

receive moisture sensor data from the plurality of first moisture sensors; determine, based on the moisture sensor data, that the humidity in at least one of the plurality of inverter housings exceeds a threshold humidity; and cause the pump to move the air in response to determining that the humidity exceeds the threshold humidity.

4. The inverter system of claim 1, wherein the dehumidification system further comprises:

a second desiccant dryer comprising a second desiccant bed, a second dryer inlet, and a second dryer outlet;

a first valve assembly configured to selectively fluidly couple the second dryer inlet to each air outlet and to selectively fluidly decouple the first dryer inlet from each air outlet; and a second valve assembly configured to selectively fluidly couple the second dryer outlet to each air inlet and to selectively fluidly decouple the first dryer outlet from each air inlet.

5. The inverter system of claim 4, further comprising a second moisture sensor configured to measure a saturation level of the first desiccant bed, a third moisture sensor configured to measure a saturation level of the second desiccant bed, and a controller communicatively coupled to the first valve assembly and the second valve assembly, the controller comprising at least one processor and at least one memory storing instructions that, when executed by the at least one processor, cause the controller to:

receive moisture sensor data from the second moisture sensor and the third moisture sensor; and upon identifying a first indication based on the moisture sensor data, cause the first valve assembly to fluidly couple the second dryer inlet to each air outlet and fluidly decouple the first dryer inlet from each air outlet, and to cause the second valve assembly to fluidly couple the second dryer outlet to each air inlet and fluidly decouple the first dryer outlet from each air inlet.

6. The inverter system of claim 5, wherein the first indication indicates that the saturation level of the first desiccant bed exceeds a maximum threshold.

7. The inverter system of claim 5, wherein the first indication indicates that the saturation level of the second desiccant bed is below a minimum threshold.

8. The inverter system of claim 5, wherein the first desiccant dryer comprises a heater adjacent the first desiccant bed and configured to evaporate water captured in the first desiccant bed, wherein the instructions further cause the controller to cause the heater to activate upon identifying the first indication.

9. The inverter system of claim 8, wherein the first dryer outlet is fluidly coupled to the second dryer outlet, wherein the instructions further cause the first valve assembly to fluidly couple the first dryer inlet to an exhaust line upon identifying the first indication.

10. The inverter system of claim 9, wherein the first dryer outlet is fluidly coupled to the second dryer outlet via a restrictor valve.

11. An inverter system comprising:

a plurality of inverter housings each containing an inverter, each housing being fully fluidly sealed from an environment outside the housing except for one or more air inlets and one or more air outlets, wherein each inverter housing includes:

at least one aperture through which electrical connections are made between the inverter and the outside of the inverter housing, wherein every aperture is fully fluidly sealed when the electrical connections are made; and an access cover openable to provide access to the inverter via an opening, wherein the opening is fully fluidly sealed when the access cover is closed;

a dehumidification system including a first desiccant dryer comprising a first desiccant bed, a first dryer inlet fluidly coupled to each air outlet, and a first dryer outlet fluidly coupled to each air inlet, wherein each of the air outlets is fluidly coupled in parallel to the first dryer inlet via a primary outlet line and each of the air inlets is fluidly coupled in parallel to the first dryer outlet via a primary inlet line; and a pump configured to move air from the air outlets to the first dryer inlet.

12. A method of drying inverter housings, the method comprising:

supplying a dried air stream to a plurality of fully fluidly sealed inverter housings;

withdrawing moist air from the inverter housings;

drying the moist air in a first desiccant dryer;

recirculating at least a first portion of the dried moist air from the first desiccant dryer to the inverter housings;

stopping a flow of the moist air to the first desiccant dryer;

drying the moist air in a second desiccant dryer; and recirculating at least a first portion of the dried moist air from the second desiccant dryer to the inverter housings.

13. The method of claim 12, further comprising heating a desiccant bed of the second desiccant dryer to evaporate water in the desiccant bed and supplying a second portion of the dried moist air to the second desiccant dryer to remove the evaporated water.

14. The method of claim 13, further comprising supplying atmospheric air to the first desiccant dryer to replace the second portion of the dried moist air.

15. The method of claim 12, wherein:

when the moist air is dried by the first desiccant dryer, the moist air is supplied to the first desiccant dryer via a first dryer inlet and the dried moist air is released from the first desiccant dryer via a first dryer outlet; and when the moist air is dried by the second desiccant dryer, the moist air is supplied to the second desiccant dryer via a second dryer inlet, the dried moist air is released from the second desiccant dryer via a second dryer outlet, and a second portion of the dried moist air is supplied from the second desiccant dryer to the first desiccant dryer via the first dryer outlet.

16. The method of claim 12, wherein the flow of the moist air to the first desiccant dryer is stopped in response to determining that a saturation level of a first desiccant bed of the first desiccant dryer exceeds a maximum threshold.

17. The method of claim 12, wherein the flow of the moist air to the first desiccant dryer is stopped in response to determining that a saturation level of a second desiccant bed of the second desiccant dryer is below a minimum threshold.

18. The method of claim 12, wherein the moist air is withdrawn from the inverter housings and dried in response to determining that a humidity in at least one of the inverter housings exceeds a maximum humidity.

* * * * *